US006960479B2

(12) United States Patent
Li et al.

(10) Patent No.: US 6,960,479 B2
(45) Date of Patent: Nov. 1, 2005

(54) STACKED FERROELECTRIC MEMORY DEVICE AND METHOD OF MAKING SAME

(75) Inventors: Jian Li, Sunnyvale, CA (US); Xiao-Chun Mu, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 223 days.

(21) Appl. No.: 09/960,125

(22) Filed: Sep. 21, 2001

(65) Prior Publication Data

US 2003/0017627 A1 Jan. 23, 2003

Related U.S. Application Data

(63) Continuation-in-part of application No. 09/909,670, filed on Jul. 20, 2001.

(51) Int. Cl.$^7$ .................. H01R 39/00; H01R 33/02; H01R 13/648; H01R 4/24
(52) U.S. Cl. .................. 438/3; 438/238; 438/239; 438/386; 438/399
(58) Field of Search .................. 438/396, 3, 253, 438/240, FOR 212; 257/E21.66, 21.272, 206, 310, E27.085, E27.104; 29/25, 24; 361/313; 365/145; 427/80

(56) References Cited

U.S. PATENT DOCUMENTS

| | | |
|---|---|---|
| 3,623,038 A | 11/1971 | Franklin et al. |
| 4,538,884 A | 9/1985 | Masaki |
| 4,593,456 A | 6/1986 | Cheung |
| 4,873,455 A | 10/1989 | de Chambost et al. |
| 4,995,705 A | 2/1991 | Yoshinaga et al. |
| 5,248,564 A * | 9/1993 | Ramesh .................. 428/688 |
| 5,438,023 A * | 8/1995 | Argos et al. .................. 438/3 |
| 5,468,684 A * | 11/1995 | Yoshimori .................. 437/228 |
| 5,499,206 A | 3/1996 | Muto |
| 5,519,566 A * | 5/1996 | Perino et al. .................. 361/321.4 |
| 5,578,867 A * | 11/1996 | Argos et al. .................. 257/632 |
| 5,592,643 A | 1/1997 | Thomas |
| 5,777,356 A * | 7/1998 | Dhote et al. .................. 257/295 |
| 5,838,035 A * | 11/1998 | Ramesh .................. 257/295 |
| 5,843,808 A | 12/1998 | Karnezos |
| 5,864,932 A * | 2/1999 | Evans et al. .................. 29/25.42 |
| 5,927,206 A | 7/1999 | Bacon et al. |
| 5,939,775 A | 8/1999 | Bucci et al. |
| 6,054,331 A * | 4/2000 | Woo et al. .................. 438/3 |
| 6,072,716 A | 6/2000 | Jacobson et al. |
| 6,072,718 A | 6/2000 | Abraham et al. |
| 6,115,281 A * | 9/2000 | Aggarwal et al. .................. 365/145 |

(Continued)

FOREIGN PATENT DOCUMENTS

JP 363 293 729 A 11/1988

OTHER PUBLICATIONS

Borca, C., et al., "Influence of dynamical scattering in crystalline poly (vinylidene fluoride–trifluoroethylene) copolymers", *Applied Physics Letters*, 74, pp. 347–349, (Jan. 18, 1999).

Borca, C., et al., "Lattice–Stiffening Transition in Copolymer Films of Vinylidene Fluoride (70%) with Trifluoroethylene (30%)", *Physical Review Letters*, pp. 4562–4565, (Nov. 29, 1999).

(Continued)

*Primary Examiner*—Long Pham
*Assistant Examiner*—Shrinivas H. Rao
(74) *Attorney, Agent, or Firm*—Tony M. Martinez

(57) ABSTRACT

The present invention relates to a ferroelectric polymer storage device including at least two stacked ferroelectric polymer memory structures that are arrayed next to at least two respective stacked topologies that are a pre-fabricated silicon substrate cavity that includes interlayer dielectric layers and via structures. Combining ferroelectric polymer and ferroelectric oxide layers on the pre-fabricated silicon substrate cavity forms a multi-rank structure.

15 Claims, 13 Drawing Sheets

U.S. PATENT DOCUMENTS

| | | | |
|---|---|---|---|
| 6,141,309 | A | 10/2000 | Saitou et al. |
| 6,171,934 | B1 * | 1/2001 | Joshi et al. ............... 438/469 |
| 6,194,229 | B1 | 2/2001 | Basceri |
| 6,210,979 | B1 | 4/2001 | Kweon et al. |
| 6,265,230 | B1 * | 7/2001 | Aggarwal et al. ............ 438/3 |
| 6,269,018 | B1 | 7/2001 | Monsma et al. |
| 6,314,641 | B1 | 11/2001 | Akram |
| 6,323,512 | B1 * | 11/2001 | Noh et al. ................. 257/295 |
| 6,324,069 | B1 | 11/2001 | Weber |
| 6,337,032 | B1 | 1/2002 | Chivukula et al. |
| 6,376,259 | B1 * | 4/2002 | Chu et al. .................... 438/3 |
| 6,420,190 | B1 | 7/2002 | Shimoda et al. |
| 6,420,740 | B1 * | 7/2002 | Zhang et al. .............. 257/295 |
| 6,495,413 | B2 * | 12/2002 | Sun et al. ................... 438/240 |
| 2001/0000005 | A1 | 3/2001 | Forrest et al. ......... 204/192.12 |
| 2002/0000005 | A1 | 1/2002 | Jermier |
| 2002/0024835 | A1 | 2/2002 | Thomson et al. |
| 2002/0044480 | A1 | 4/2002 | Gudesen et al. |
| 2002/0074601 | A1 * | 6/2002 | Fox et al. |
| 2002/0093845 | A1 | 7/2002 | Matsuoka et al. |
| 2003/0017627 | A1 * | 1/2003 | Li et al. |

OTHER PUBLICATIONS

Bune, A., et al., "Piezoelectric and pyroelectric properties of ferroelectric Langmuir–Blodgett polymer films", *Journal of Applied Physics*, 85, pp. 7869–7873, (Jun. 1, 1999).

Bune, A., et al., "Two–dimensional ferroelectric films", *Nature*, 391, pp. 874–877, (Feb. 26, 1998).

Choi, J., et al., "Phase transition in the surface structure in copolymer films of vinylidene fluoride (70%) with trifluoroethylene (30%)", *Physical Review B*, 61, pp. 5760–5770, (Feb. 15, 2000).

Desu, S., "Minimization of Fatigue in Ferroelectric Films", *Phys. Stat. Sol.* (a) 151, pp. 467–480, (1995).

Ducharme, S., et al., "Ultrathin Ferroelectric Polymer Films", *Ferroelectrics*, 202, pp. 29–37, (1997).

Lovinger, A.J., "Ferroelectric Polymers", *Science*, 220, pp. 1115–1121, (Jun. 10, 1983).

Morikawa, E., et al., "Photoemission study of direct photomicromachining in poly (vinylidene fluoride)", *Journal of Applied Physics*, 87, pp. 4010–4016, (Apr. 15, 2000).

IBM Technical Disclosure Bulletin. vol. 37 (11), p. 421–424, 1994.

Borca et al., "Influence of dynamical scattering in crystalline poly (vinylidene fluoride–triflurroethulene) copolymers", Applied Physics Letters, vol. 72, 347–349, Jan. 18, 1999.

Borca et al., "Lattice–Stiffening Transition in Copolymer Films of Vinylidene Fluoride (70%) with Triflouroethylene (30%)", Physical Review Letters, 4562–4565, Nov. 29, 1999.

Bune et al., "Piezoelectric and pyroelectric properties of ferroelectric Langmuir–Blodgett polymer films", Journal of Applied Physics, vol. 85, 7869–7873, Jun. 1, 1999.

Bune et al., "Two–dimensional ferroelectric films", Nature, vol. 391, 874–877, Feb. 26, 1998.

Choi et al., "Phase transistion in the surface structure in copolymer films of vinylidene flouride (70%) with triflouroethylene (30%)", Physical Review B, vol. 61, 5760–5770, Feb. 15, 2000.

Desu et al., "Minimization of Fatigue in Ferroelectric Films", Phys. Stat. Sol,(a) 151, 467–480, (1995).

Ducharme et al., "Ultrathin Ferroelectric Polymer Films", Ferroelectrics, vol. 202, 29–37, (1997).

AJ Lovinger, "Ferroelectric Polymers", Science, vol. 220, 1115–1121, Jun. 10, 1993.

Morikawa et al., "Photoemission study of direct photomicromachining in poly (vinylidene flouride)", Journal of Applied Physics, vol. 87, 4010–1016, Apr. 15, 2000.

* cited by examiner

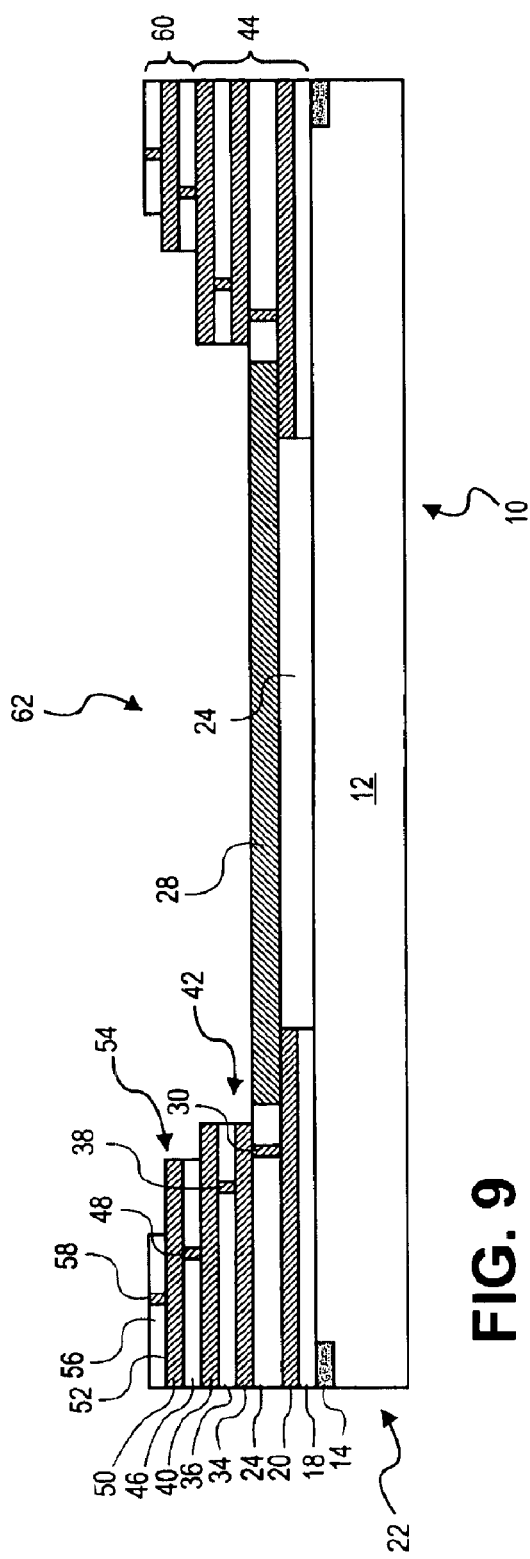
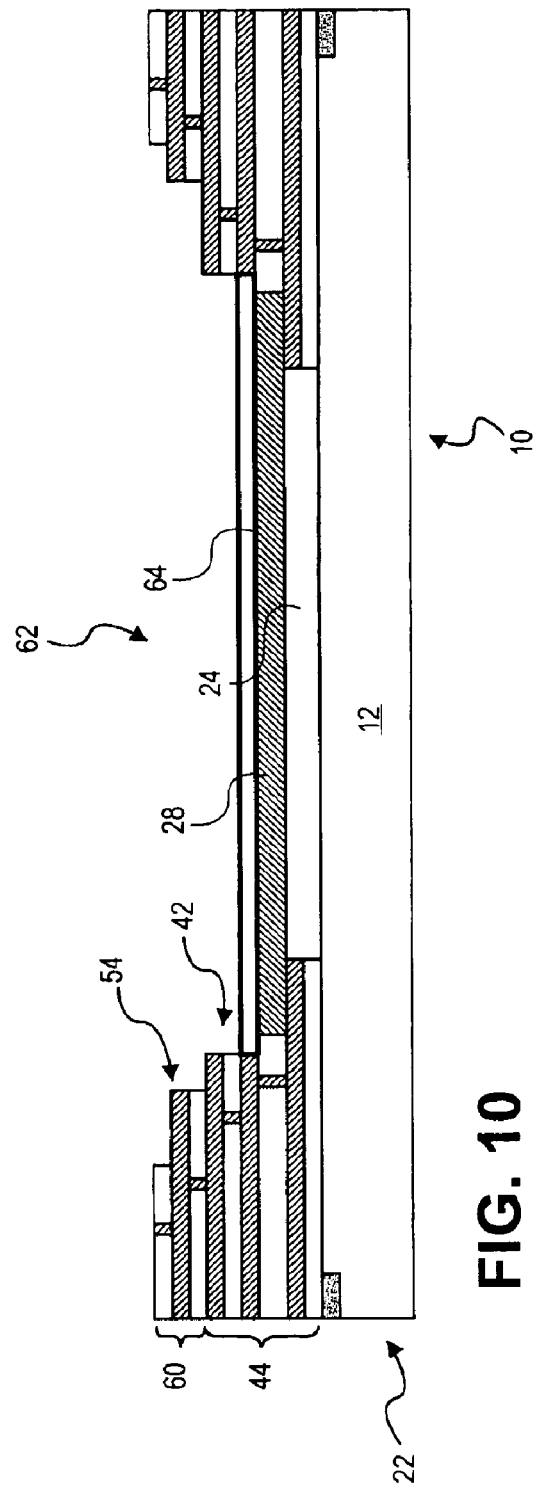

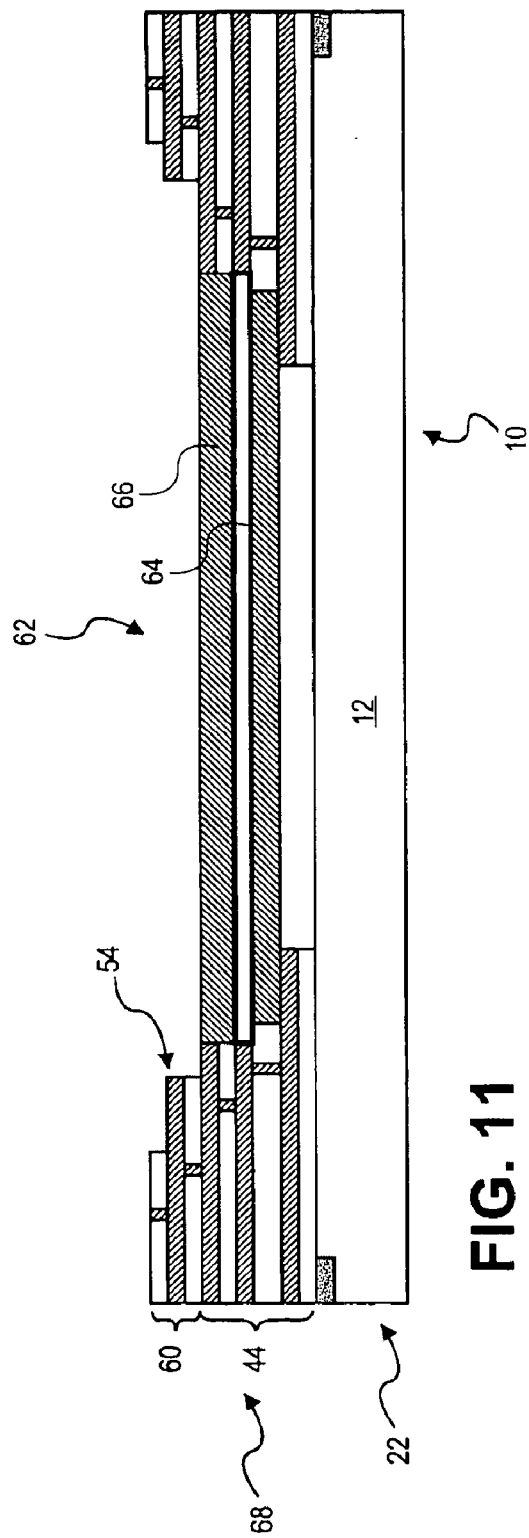
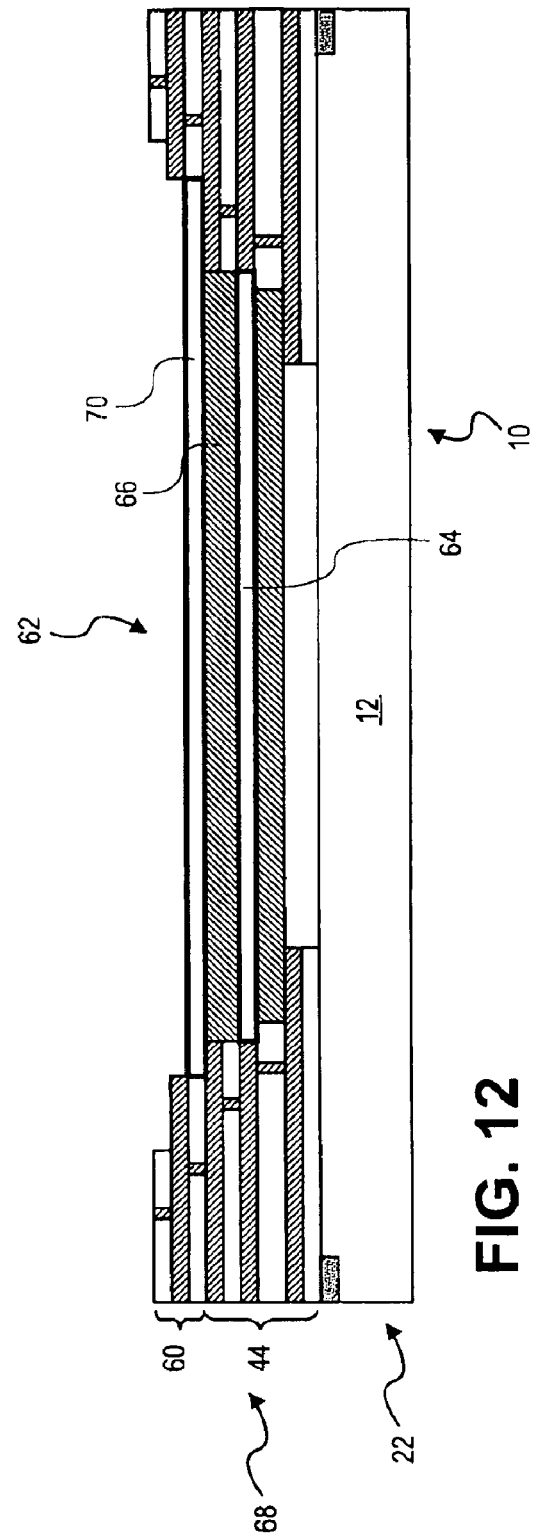
FIG. 11
FIG. 12

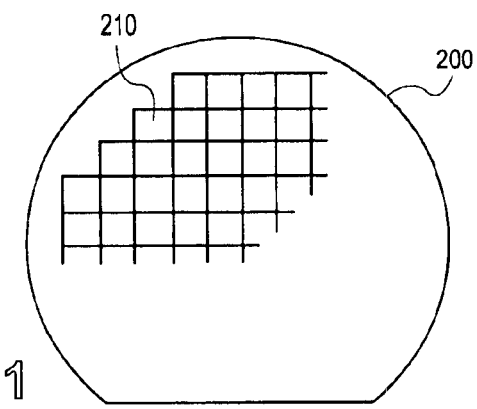
FIG. 21
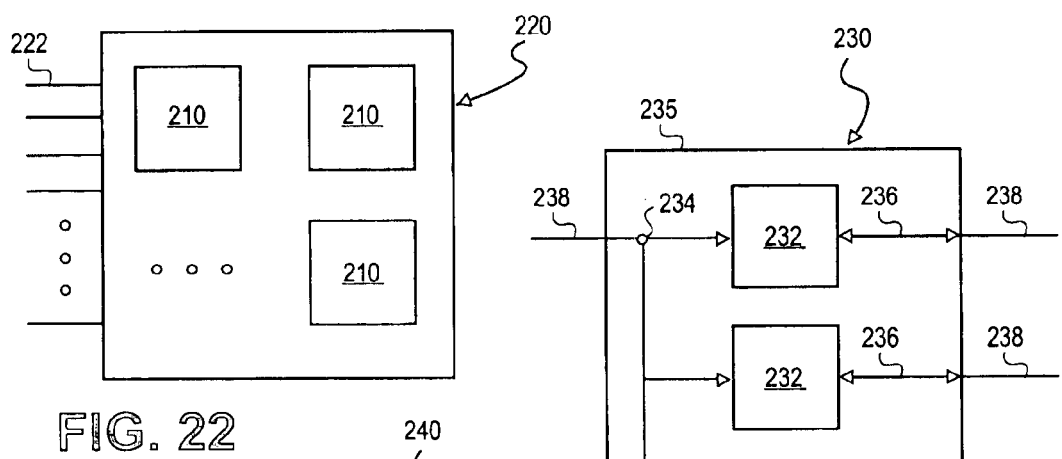
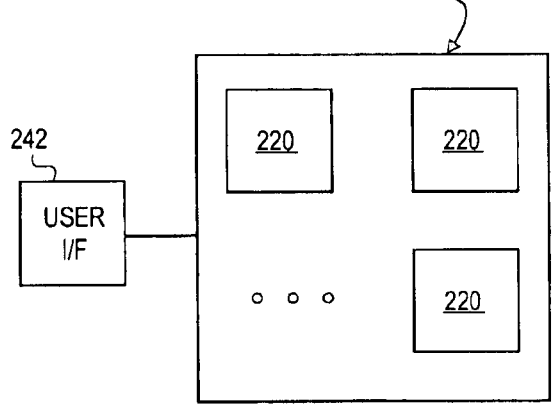
FIG. 22
FIG. 23
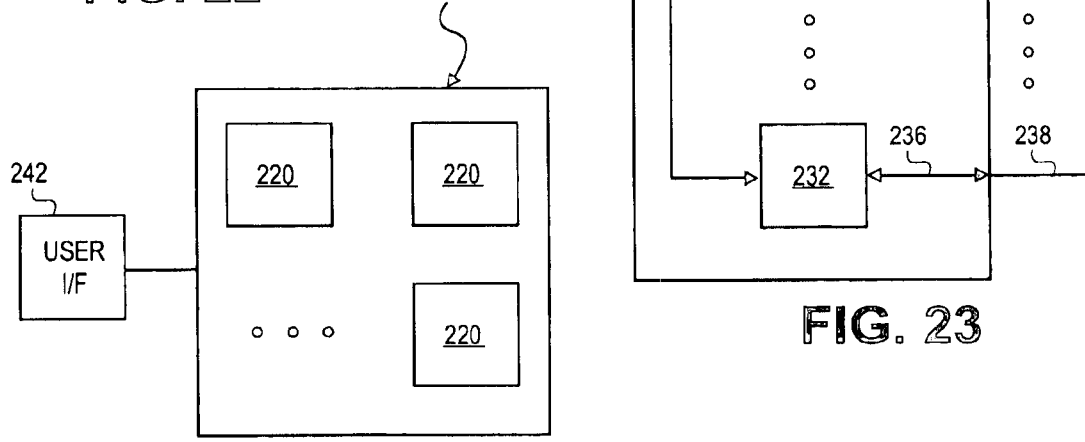
FIG. 24

US 6,960,479 B2

STACKED FERROELECTRIC MEMORY DEVICE AND METHOD OF MAKING SAME

RELATED APPLICATIONS

The present invention is a Continuation-In-Part of U.S. patent application Ser. No. 09/909,670, filed on Jul. 20, 2001, entitled, STEPPED STRUCTURE FOR A MULTI-RANK, STACKED POLYMER MEMORY DEVICE AND METHOD OF MAKING SAME, the entire disclosure of which is incorporated by specific reference.

FIELD OF THE INVENTION

The present invention relates generally to microelectronic device fabrication. More particularly, the present invention relates to fabrication of a microelectronic storage device. In particular, the present invention relates to a multi-rank, stacked cross-point ferroelectric memory device using both ferroelectric polymer and ferroelectric oxide layers.

BACKGROUND OF THE INVENTION

DESCRIPTION OF RELATED ART

In the microelectronics field, continual pressure exists to find faster, denser, and more cost-effective solutions to data storage. One particular area of interest is higher storage capacity per unit area of a substrate. Whether the data storage is fast, on-die storage such as static random access memory (SRAM), whether it is the somewhat slower embedded dynamic random access memory (eDRAM), the even slower off-die dynamic random access memory (DRAM), or whether it is magnetic- or magneto optical disks for mass storage, each technology is constantly being advanced to meet the demand for increased speed and capacity, and for lower voltage operation.

It was discovered that some polymers exhibit ferromagnetism. One such polymer is poly vinylidene fluoride (PVDF, whose repeat formula is $(CH_2-CF_2)_n$) and some of its copolymers. To these polymers other classes of polymers that are referred to as ferroelectric polymers (FEPs).

Ferroelectric oxide (FEO) materials have also been viewed with interest as a memory cell material, but until recently, the read/write cycle of such materials failed the rigorous demands of a memory device such as a dynamic random access memory (DRAM).

One activity involved in operation of a ferroelectric data storage device relates to increasing storage capacity for a given substrate.

BRIEF DESCRIPTION OF THE DRAWINGS

In order that the manner in which the embodiments of the invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which:

FIG. 9 is an elevational view of the memory device depicted and FIG. 8 after further processing;

FIG. 10 is an elevational view of the memory device depicted and FIG. 9 after further processing;

FIG. 11 is an elevational view of the memory device depicted in FIG. 10 after further processing;

FIG. 12 is an elevational view of the memory device depicted in FIG. 11 after further processing;

FIG. 21 is a top plan schematic view of a silicon wafer;

FIG. 22 is a schematic view of a circuit module 220;

FIG. 23 is a schematic view of one embodiment of a circuit module as a memory module;

FIG. 24 is a schematic view of an electronic system;

DETAILED DESCRIPTION OF THE INVENTION

Figure 1:
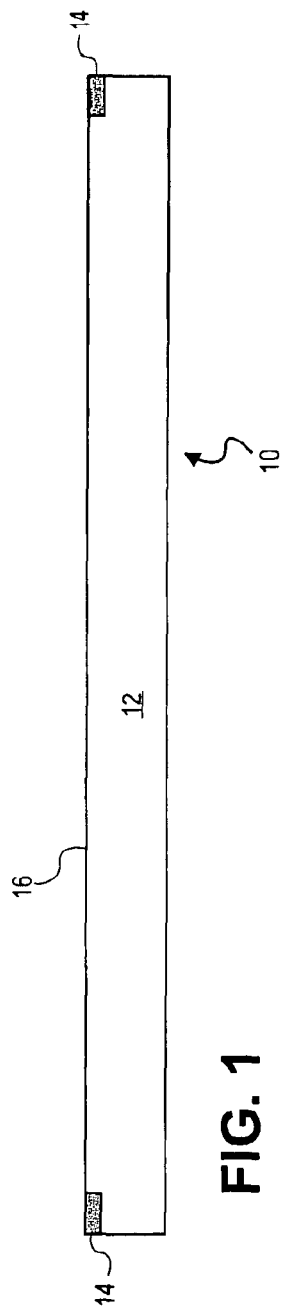
FIG. 1 is an elevational view of a memory device during fabrication according to an embodiment of the present invention.

The present invention relates to a multi-rank, stacked ferroelectric storage device. The invention may include a ferroelectric layer that is sandwiched between two series of electrodes that achieve electrical signaling across the ferroelectric layer. In some applications, the ferroelectric memory device may preferably be stacked ferroelectric memory structures.

In a stacked, multi-rank design for ferroelectric polymer (FEP) materials, there is a restriction to using conventional integrated circuit interconnect fabrication technology which requires high-temperature chemical vapor deposition such as up to about 500° C., to form interlayer dielectrics and vias such as a tungsten (W) via. As these high temperatures, FEP layers would be damaged. However, with the use of ferroelectric oxide (FEO) layers, higher processing temperatures may be used.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

The present invention may employ either ferroelectric polymer (FEP) materials, or ferroelectric oxide materials.

Ferroelectric Polymer Materials

Where the memory device contains an FEP memory layer, ferroelectric polymers may be formed by various processes. In one embodiment, the FEP layers are made from a ferroelectric polymer selected from polyvinyl and polyethylene fluorides, copolymers thereof, and combinations thereof. In another embodiment, the FEP layers are made from a ferroelectric polymer selected from polyvinyl and polyethylene chlorides, copolymers thereof, and combinations thereof. In another embodiment, the FEP layers are made from a ferroelectric polymer selected from polyacrylonitriles, copolymers thereof, and combinations thereof. In another embodiment, the FEP layers are made from a ferroelectric polymer selected from polyamides, copolymers thereof, and combinations thereof. Other embodiments may include combinations of the above that cross different types such as polyfluorides and polyamides or polyfluorides and polyacrylonitriles.

In one embodiment, the FEP layers are made from a ferroelectric polymer selected from $(CH_2—CF_2)_n$, $(CHF—CF_2)_n$, $(CF_2—CF_2)_n$, α-, β-, γ-, and δ-phases thereof, preferably the β-phase, $(CH_2—CF_2)_n—(CHF—CF_2)_m$ copolymer, α-, β-, γ-, and δ-phases, preferably the β-phase of $(CH_2—CF_2)_n—(CHF—CF_2)_m$ copolymer, and combinations thereof. The copolymer of $(CH_2—CF_2)_n—(CHF—CF_2)_m$ may be referred to as P(VDF-TrFE) or poly vinylidene fluoride-triflouroethylene. In one particular embodiment, the FEP layers are made from a ferroelectric polymer selected from a β-phase copolymer of $(CH_2—CF_2)_n —(CHF—CF_2)_m$ wherein n and m equal 1, and wherein n is in a fraction range from about 0.6 to about 0.9, preferably from about 0.7 to about 0.8, and more preferably about 0.75.

Most polymer systems will exhibit some degree of atacticity. Where a ferroelectric copolymer is formed by the spin-on technique, the FEP layer will tend more away from isotacticity than for a monomer under similar deposition conditions. In one embodiment, the ordered amount of crystallinity (degree of isotacticity) in an FEP layer is in a range from about one-third to about two-thirds, preferably greater that about one-half. The ordered amount of the crystalline structure may be quantified by diagnostic techniques such as scanning electron microscopy, x-ray diffraction, and others. Greater isotacticity may be achievable by other deposition techniques such as Langmuir-Blodgett deposition as is known in the art.

Ferroelectric Oxide Materials

FEO materials may be obtained from thin oxide layers of metals, such as barium-strontium-titanates (BST) and strontium-bismuth-tantalates (SBT), by way of non-limiting example. These materials have excellent resistance to read/write fatigue. Suitable metal oxides are typically deposited to a substrate in the vapor phase such as in CVD processing or physical vapor deposition (PVD) processing. Typically and preferably, the FEO layer, generically termed, may be a metal-containing, and more preferably a dielectric metal element-containing, material. The metal-containing layer can include a single metal or a metal alloy containing a mixture of metals. The metal element-containing layer can also be an oxide, sulfide, selenide, telluride, nitride, or combination thereof, for example. Preferably, the FEO layer is a metal element-containing oxide layer.

According to the present invention, FEO layers are preferably films containing low valent metals, such as barium, strontium, calcium, etc., which are extremely useful in the preparation of FEO materials such as BST, and SBT. The FEO layer may be formed by being vaporized in the presence of a gas, which can be inert or reactive to form an FEO memory layer. The carrier gas can be selected from a wide variety of gases that are generally unreactive with the CVD feed materials and do not interfere with the formation of a metal element-containing layer. Examples include nitrogen, helium, argon, and mixtures thereof The reaction gas can be selected from a wide variety of gases reactive under the conditions of CVD. Examples of reaction gases include oxygen, ozone, nitrogen oxides, ammonia, hydrazine, water vapor, hydrogen sulfide, hydrogen selenide, and hydrogen telluride. Various combinations of carrier gases and/or reaction gases can be used in the methods of the present invention.

The resultant memory layer therefore can be an oxide, sulfide, nitride, selenide, telluride, etc., or mixtures thereof, generically referred to as an FEO memory layer, for example. Preferably, the FEO memory layer is an oxide layer.

Structure of a Ferroelectric Memory Device

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

FIG. 1 is an elevational cut-away view of a ferroelectric memory device 10 during a process flow according to an embodiment. FIG. 1 illustrates a substrate 12 upon which the memory device 10 may be formed. Typically, substrate 12 may be selected from microprocessor silicon, inorganic interlayer dielectric (ILD) material such as silicon oxide, organic ILD material such as polyimide, or others. Substrate 12 is depicted with a logic region 14 that may be a complementary metal oxide semiconductor (CMOS) logic region 14. Logic region 14 is depicted as sharing an upper surface 16 of substrate 12. Logic region 14 may contain circuitry such as an embedded processor in addition to row- and column-address circuitry that deals with sneak signal extraction that is germane to the embodiments.

During the process flow embodiment, a series of ILD layers and metallization layers are built up to form a topology that reveals a cavity. Thereafter, a series of ferroelectric memory structures are fabricated to fill the cavity.

Figure 2:
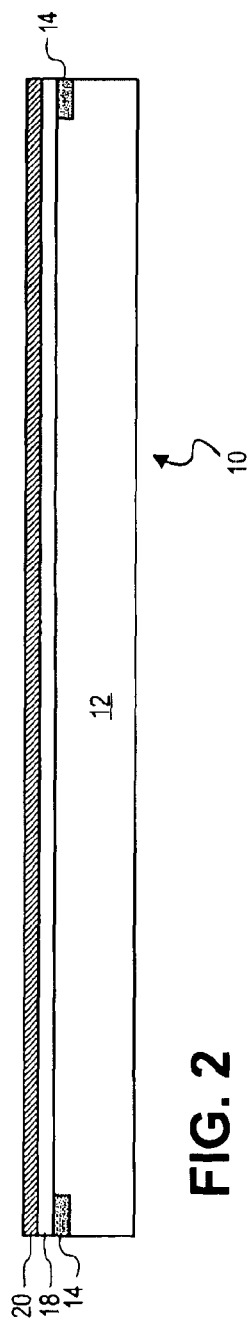
FIG. 2 is an elevational view of the memory device depicted in FIG. 1 after further processing.

FIG. 2 illustrates further processing. A first ILD (ILD1) layer 18 is formed over substrate 12 and logic region 14. ILD1 layer 18 may be a formed by deposition of an oxide material such as a silicon oxide ($Si_xO_y$, such as silica, $SiO_2$), a nitride such as silicon nitride ($Si_xN_y$, such as $Si_3N_4$), or a polyimide material that is spun on and cured. ILD1 layer 18 may be a passivation ILD material such as a polyimide material as is known in the art, or it may be a silicon oxynitride (SiON) film made by plasma-enhanced (PECVD) at a low deposition temperature. Blanket formation of ILD1 layer 18 may be done such as by spin-on processing of a polyimide material as is known in the art.

In another embodiment and as to all ILD layers in an embodiment, an inorganic material may be deposited, subject only to avoiding temperature elevation that will compromise the quality of the ferroelectric memory structures if they comprise FEP layers. For example atomic layer CVD (ALCVD) may be carried out according to known technique to form ILD1 layer 18. In one embodiment, ILD1 layer 18 is formed by chemical vapor deposition (CVD) of a silicon oxide material to a thickness in a range from about 0.25 micrometers (microns) to about 1.5 microns, preferably from about 0.5 microns to about 1 micron.

After the formation of ILD1 layer 18, a first metallization or metal-1 (M1) layer 20 is formed that comprises a first pin-out precursor. Formation of M1 layer 20 may be carried out by physical vapor deposition (PVD), CVD, or plasma-enhanced CVD (PECVD) of a metal to a thickness in a range from about 0.1 microns to about 1 micron, preferably from about 0.2 microns to about 0.6 microns. M1 layer 20 may be blanket sputtered from a metal target such as a refractory metal. Formation of M1 layer 20 may be carried out by CVD, PECVD, or the like, or by PVD or the like. By way of non-limiting example, M1 layer 20 may comprise aluminum (Al), copper (Cu), silver (Ag), gold (Au), or the like or combinations thereof. M1 layer 20 may also be a metal such as titanium (Ti), zirconium (Zr), hafnium (Hf), or the like or combinations thereof. Other metals for M1 layer 20 may include nickel (Ni), cobalt (Co), palladium (Pd), platinum (Pt), or the like or combinations thereof. Other metals for M1 layer 20 may include chromium (Cr), molybdenum (Mo), tungsten (W), or the like or combinations thereof.

Figure 3:
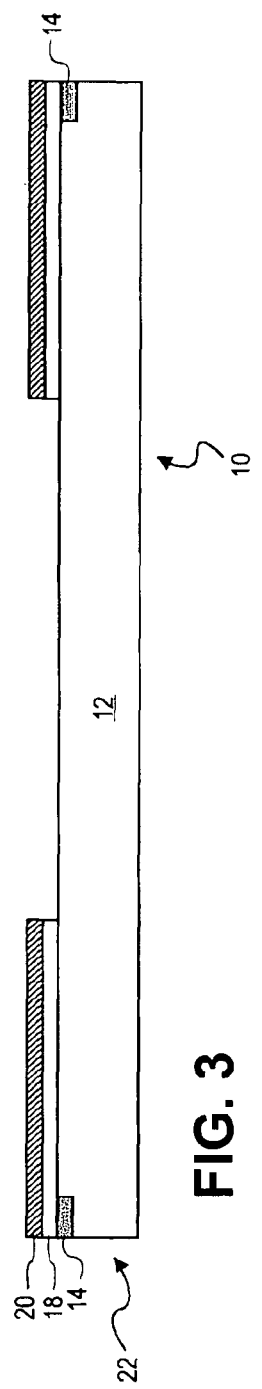
FIG. 3 is an elevational view of the memory device depicted in FIG. 2 after further processing.
Figure 4:
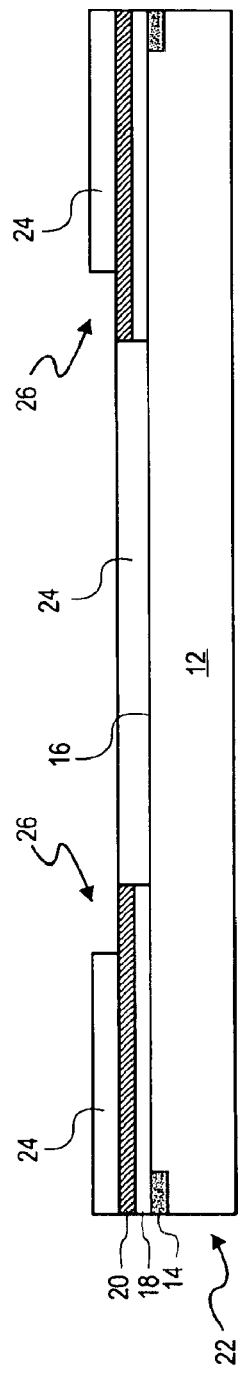
FIG. 4 is an elevational view of memory device in FIG. 3 after further processing.

After the deposition of M1 layer 20, patterning is carried out. FIG. 3 illustrates patterning of M1 layer 20 that results in an electrical path from M1 layer 20 to the edge 22 of substrate 12. Thereafter, a second ILD (ILD2) layer 24 is blanket formed and patterned on two levels as depicted in FIG. 4. ILD2 layer 24 is first blanket deposited by a process that may match deposition formation of ILD1 layer 18, or a different process or material or both may be used. A center-patterning 26 that stops on M1 layer 20 leaves ILD2 layer 24 disposed in one section directly upon upper surface 16, and in another section above and on M1 layer 20 out to edge 22 of substrate 12.

Figure 5:
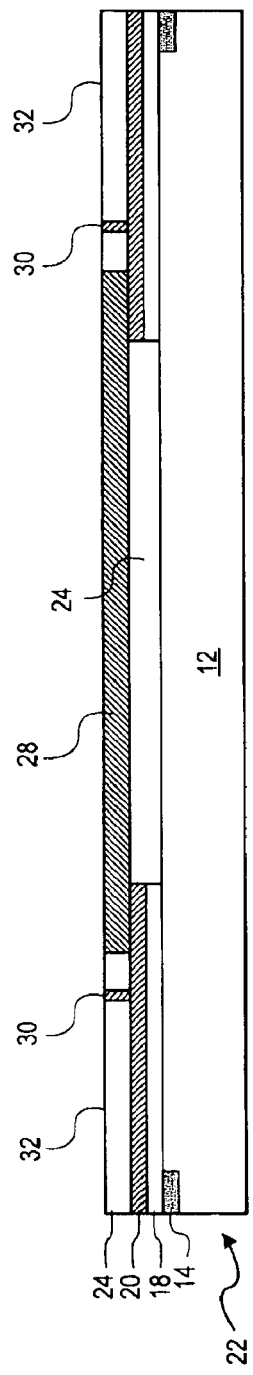
FIG. 5 is an elevational view of the memory device depicted in FIG. 4 after further processing.

FIG. 5 illustrates further processing wherein a first electrode 28 and a first via 30 are formed. First via 30 is formed by etching a contact corridor with a diameter of about 0.2 to about 1.5 microns, preferably from about 0.5 to about 1 micron and a depth in a range from about 1 micron to about 2.5 microns, preferably from about 1.5 microns to about 2 microns. The depth of first via 30 is established by the thickness of ILD2 layer 24 where the etch stops on M1 layer 20.

In an alternative embodiment, first electrode 28 and first via 30 may be formed simultaneously by simultaneously etching center-patterning 26 and the contact corridor for via 30, and by CVD depositing both first electrode 28 and via 30. Some reflow of metal into via 30 may be required. In that case, a first film (not pictured) such as a Ti of TiN liner layer or the like may first be deposited by a CVD process, followed by a CVD of a metal such as Al, followed by a reflow process, and finally followed by an etchback or a planarization such as chemical-mechanical planarization (CMP).

In another alternative embodiment, first electrode 28 is blanket deposited and etched back to an upper surface 32 of the ILD2 layer 24 section that is at edge 22 of substrate 12. Next a contact corridor etch is carried out, followed by a CVD of material to form first via 30 and its necessary processing. Thereafter, first electrode 28 is patterned into individual lines arrayed in a first direction that may have a width in a range from about 0.13 microns (which may be a minimum photolithographic feature) to about 1 micron, preferably from about 0.25 microns (which may be a minimum photolithographic feature) to about 0.5 microns.

In any event, first electrode 28 is patterned into individual electrodes that may have a width in a range from about 0.13 microns to about 1 micron, preferably from about 0.25 microns to about 0.5 microns. By way of further reference, according to design rules, a minimum feature may be part of the metric of the ferroelectric memory device 10 depicted in the figures. For example, photolithography process flows may have minimum features that are 0.25 micrometers (microns), 0.18 microns, and 0.13 microns. It is understood that the various metrics such as 0.25 microns may have distinctly different dimensions in one business entity from a comparative business entity. Accordingly, such metrics, although quantitatively called out, may differ between a given two business entities. Other minimum features that may be accomplished in the future are applicable to the present invention.

Figure 6:
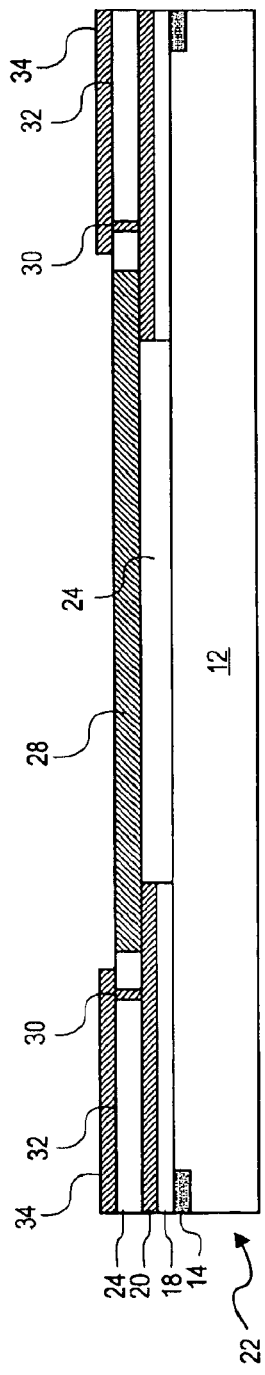
FIG. 6 is an elevational view of the memory device depicted in FIG. 5 after further processing.

FIG. 6 illustrates further processing. After formation of first electrode 28 and first via 30, a metal-2 (M2) layer 34 is deposited and patterned. M2 layer 34 may be formed by similar processes as M1 layer 20. In one embodiment, M2 layer 34 is formed by PVD of Al in a thickness range from about 0.1 microns to about 1 micron, preferably from about 0.2 microns to about 0.5 microns.

Figure 7:
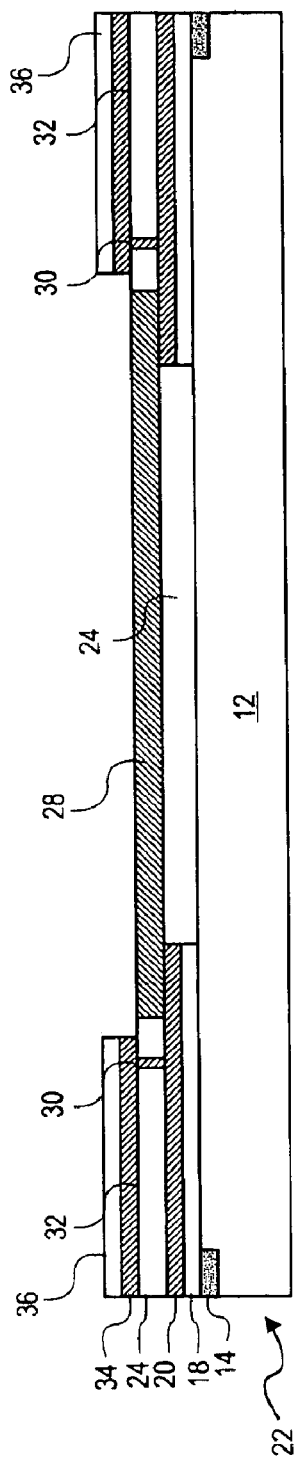
FIG. 7 is an elevational view of the memory device depicted in FIG. 6 after further processing.

After the formation of M2 layer 34, a third ILD (ILD3) layer 36 is formed as depicted in FIG. 7. ILD3 layer 36 may be formed as set forth herein for other ILD layers. In one embodiment, ILD3 layer 36 is formed by CVD of an inorganic material such as silica. Thereafter, ILD3 layer 36 is patterned to expose first electrode 28 as a bottom electrode for a first memory device. In one embodiment, M2 layer 34 and ILD3 layer 36 are sequentially blanket deposited, and a single etch is carried out that stops on ILD2 layer 24.

Figure 8:
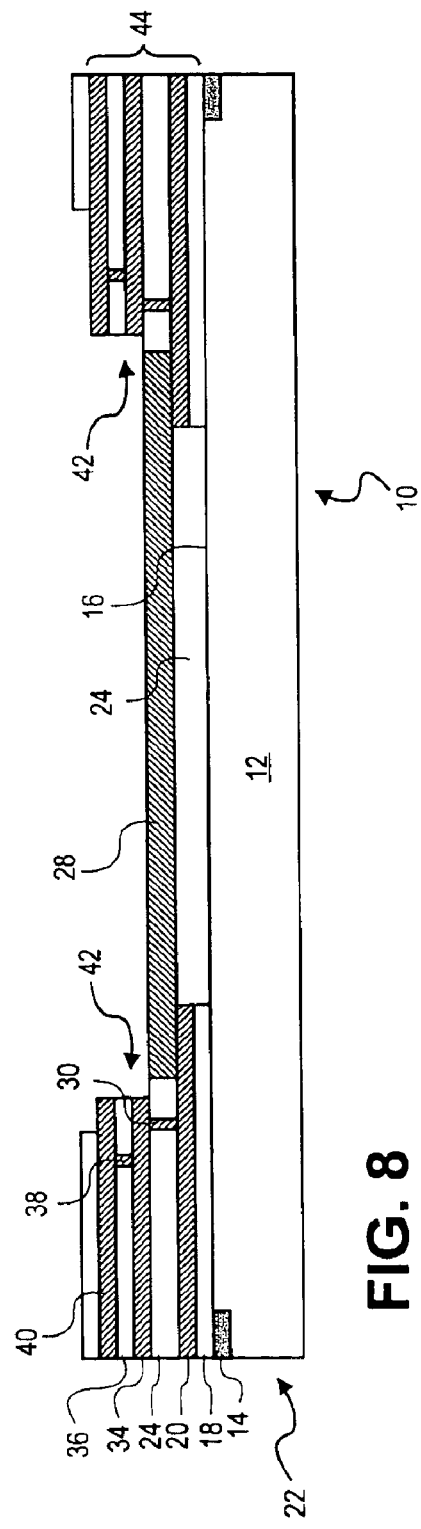
FIG. 8 is an elevational view of the memory device depicted in FIG. 7 after further processing.

FIG. 8 illustrates further processing. After the deposition of ILD3 layer 36, a second via 38 is opened through ILD3 layer 36, and filled. Alternatively, second via 38 is opened, a blanket deposition is made over an unpatterned ILD3 layer 36, a CMP or etchback process or both is carried out that forms an M3 layer 40, and a single etch process is carried out that etches through M3 layer 40, ILD3 layer 36, and M2 layer 34, and that stops on first electrode 28 and ILD2 layer 24. Thereby an inner vertical edge 42 includes vertically aligned borders of M2 layer 34, ILD3 layer 36, and M3 layer 40.

The composite elevational structure of ILD1 layer 18, M1 layer 20, ILD2 layer 24, first electrode 28, M2 layer 34, ILD3 layer 36, and M3 layer 40 may be referred to as a first topology 44 as will be referred to hereinafter. First topology 44 may be defined as a unit of ILD and metallization build-up above upper surface 16 of substrate 12 that houses a ferroelectric memory layer. Another definition for a first topology may omit ILD3 layer 36 or it may include additional layers.

FIG. 9 illustrates further processing that may be referred to as the beginning of a second topology. After the formation of M3 layer 40, a fourth ILD (ILD4) layer 46 is deposited and a third via 48 is opened that communicates through ILD4 layer 46 to M3 layer 40. Additionally, a metal-4 (M4) layer 50 is formed over ILD4 layer 46 and is likewise patterned. In one embodiment, ILD4 layer 46 may be formed, third via 48 may be opened, and a blanket deposition of metal may be made such as by CVD, wherein third via 48 is filled and a precursor or M4 layer 50 is deposited. CMP may be used to form an upper surface 52 of M4 layer 50. Thereafter, a simultaneous etch may be carried out to etch through M4 layer 50 and ILD4 layer 46 to create an inner vertical edge 54.

After the formation of M4 layer 50, a fifth ILD (ILD5) layer 56 is formed and a fourth via 58 is opened that communicates to M4 layer 50. The elevational combination of ILD4 layer 46, M4 layer 50, and ILD5 layer 56 constitute a second topology 60 that is disposed over first topology 44. As depicted in FIG. 9, a stepped structure comprising first topology 44 and second topology 60 reveals a cavity 62 into which ferroelectric memory layers are placed.

FIG. 10 illustrates further processing. According to an embodiment, a ferroelectric polymer (FEP) layer is formed. According to another embodiment, a ferroelectric oxide (FEO) layer is formed.

Typically, FEP material is formed over first electrode 28 and structures supported thereon by spin-on processing. Other processes may be carried out to form FEP layers, including CVD, substrate dip deposition, Langmuir-Blodgett deposition, and spray-on deposition according to known technique.

In one embodiment, FEP material is spun-on by depositing the FEP material as a fluid in a puddle prime over substrate 12 for a period of from about 5 to 25 seconds and spinning substrate 12 and in a rotational range from about 300 rpm to about 6000 rpm and for a time range from about 5 seconds to about 20 seconds. FEP material processing conditions to form FEP layers is illustrated in FIG. 10.

FIG. 10 depicts the results of a spin-on FEP layer, a center masking thereof, and an etch process to remove peripheral FEP material beyond the inner vertical edges 42 of first topology 44. In other words, FEP material is removed near and at second topology 60.

A preferred vertical thickness of an FEP layer may be in a range from about 500 Å to about 2,000 Å or larger, subject only to the design rules of a specific application. Other thicknesses for the FEP layers may be in a range from about 1,000 Å to about 1,500 Å. In one embodiment, the FEP layers may be about 1,250 Å.

Where the ferroelectric memory device is an FEO, the thickness may be in a range from about 500 Å to about 2,500 Å, and preferably from about 1,000 Å to about 2,000 Å. Patterning and etching may be similarly carried out to achieve first ferroelectric memory layer 64 comprising an FEO material as generically referred to herein.

As depicted in FIG. 10, a first ferroelectric memory layer 64 is formed above and on electrode 28. Where the first ferroelectric layer 64 is an FEP material, it may be spun on, and center masked, and etched with an oxygen plasma etch as is known in the art, such as using oxygen plasma at about 23° C. and about one atmosphere. Where first ferroelectric layer 64 is an FEO material, it may be formed by PVD, center masked, and dry etched using a reactive ion etch (RIE) as is known in the art for FEO materials. Alternatively, peripheral masking may be carried out that encroaches inwardly from edge 22 to inner vertical edge 42, and a PVD process achieves first ferroelectric memory layer 64.

In any event, all peripheral ferroelectric material is removed within cavity 62, first ferroelectric layer 64 is sized in preparation to make connection with a series of electrodes at this topology.

FIG. 11 illustrates further processing. After the formation of first ferroelectric memory layer 64, a second electrode 66 is formed. Second electrode 66 is deposited by any process such as that for first electrode 28. Second electrode 66 is thereafter patterned in a cross-point configuration to first electrode 28. Line widths for second electrode 66 may be selected to match line widths of first electrode 28. In one embodiment, line widths for second electrode 66 are in a range from about 0.13 microns to about 0.5 microns, and preferably from about 0.18 microns to about 0.25 microns. The composite of first electrode 28, first ferroelectric memory layer 64, and second electrode 66, along with the structures that make up first topology 44, may be referred to as a first ferroelectric memory structure 68. Alternatively, first ferroelectric memory structure 68 may include only first electrode 28, first ferroelectric memory layer 64, and second electrode 66.

After the formation of first ferroelectric memory structure 68, further processing is carried out as depicted in FIG. 12. A second ferroelectric memory layer 70 is formed over second electrode 66. Depositing, center patterning, and etching is carried out as set forth herein, depending upon whether second ferroelectric memory layer 70 is an FEP or an FEO material.

Figure 13:
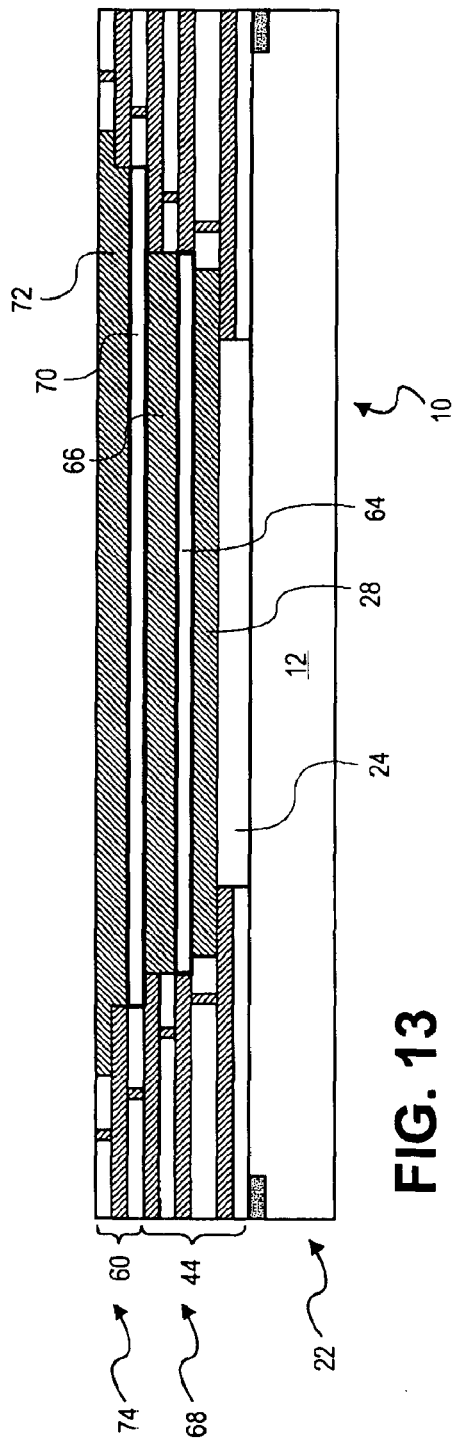
FIGS. 13 is an elevational view of the memory device depicted in FIG. 12 after further processing.

FIG. 13 illustrates further processing. After the formation of second ferroelectric memory layer 70, a third electrode 72 is deposited and cross-point patterned with second electrode 66 according to techniques set forth herein for either first electrode 28, or second electrode 66. Accordingly, the composite of second electrode 66, second ferroelectric memory layer 70, and third electrode 72, along with second topology 60, may be referred to as a second ferroelectric memory structure 74. Alternatively, second ferroelectric memory structure 74 may include only second electrode 66, second ferroelectric memory layer 70, and third electrode 72.

Figure 14:
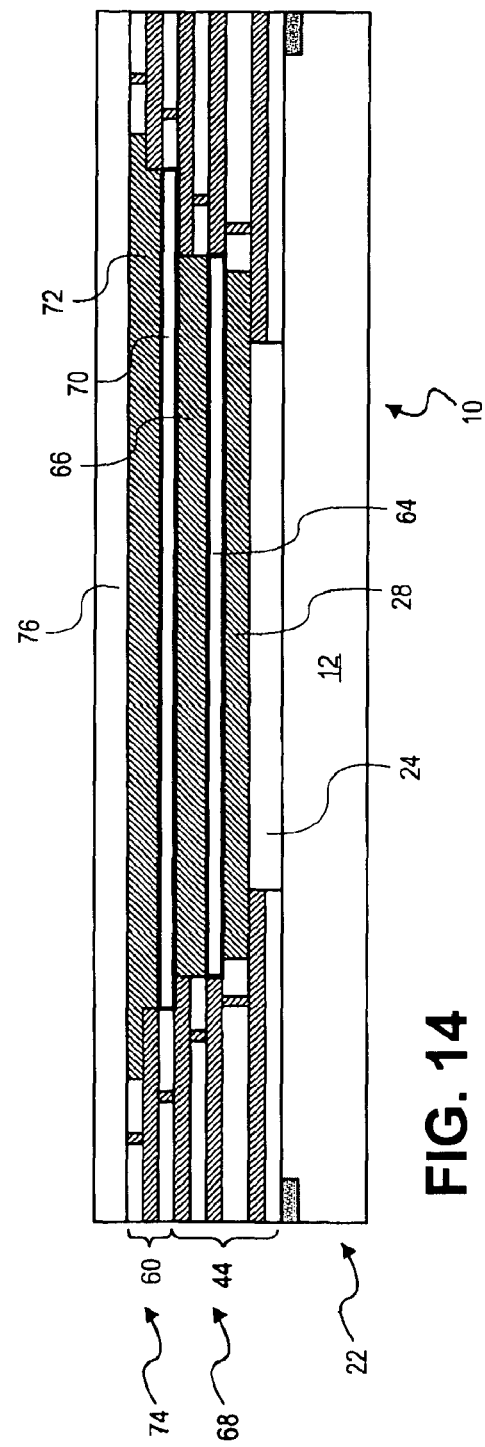
FIG. 14 is an elevational view of the memory device depicted in FIG. 13 after further processing.
Figure 15:
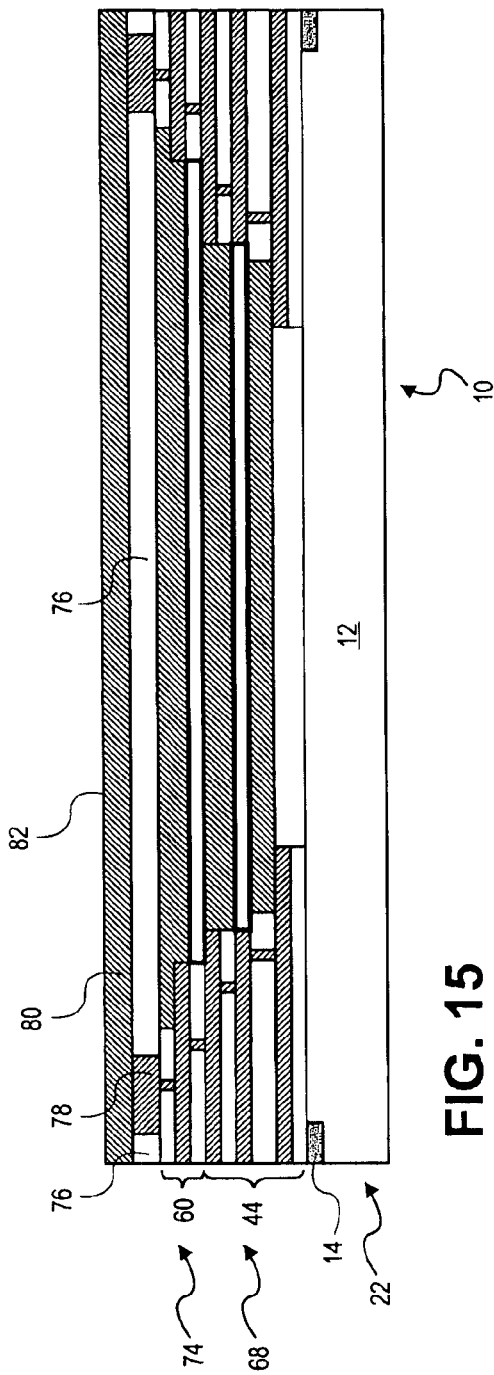
FIG. 15 is an elevational view of the memory device depicted in FIG. 14 after further processing.

In FIG. 14, further processing is illustrated in which a sixth ILD (ILD6) layer 76 is formed over the entire first and second ferroelectric memory structures 68, 74. FIG. 15 illustrates patterning of ILD6 layer 76 and the opening of a fifth via 78 that is filled with an electrical conductor. Thereafter, a fourth electrode 80 is formed over fifth via 78. Fifth via 78 may have a contact corridor diameter (characteristic dimension) in the range from about 0.5 microns to about 2.5 microns, preferably from about 1 micron to about 2 microns.

Alternatively, fifth via 78 may be opened, and a blanket deposition of electrically conductive material as set forth herein is carried out with optional reflow into fifth via 78 as set forth herein for other vias. Thereafter, planarization may be carried out to achieve an upper surface 82 of fourth electrode 80. Patterning of fourth electrode 82 may be carried out in preparation for a third ferroelectric memory structure.

Figure 16:
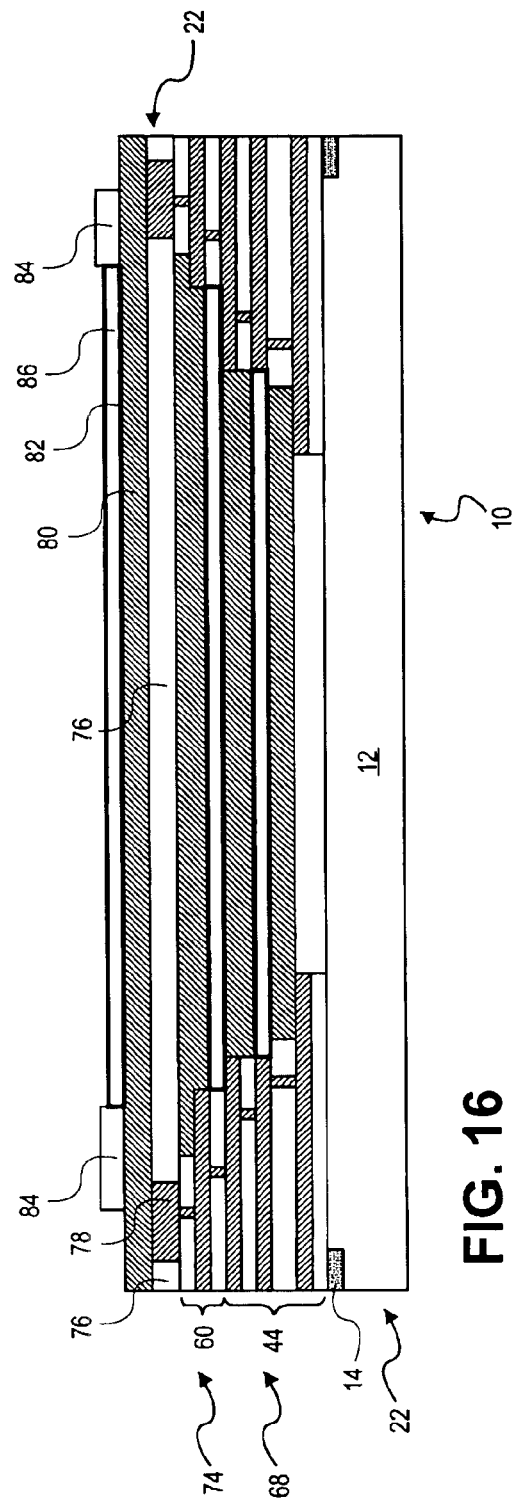
FIG. 16 is an elevational view of the memory device depicted in FIG. 15 after further processing.

FIG. 16 illustrates further processing in which a seventh ILD (ILD7) layer 84 is deposited as set forth herein, and patterning is carried out. Patterning of ILD7 layer 84 is carried out to expose fourth electrode 80 at edge 22 of ferroelectric memory device 10. Thereafter, a third ferroelectric memory layer 86 is deposited and patterned as set forth herein.

Figure 17:
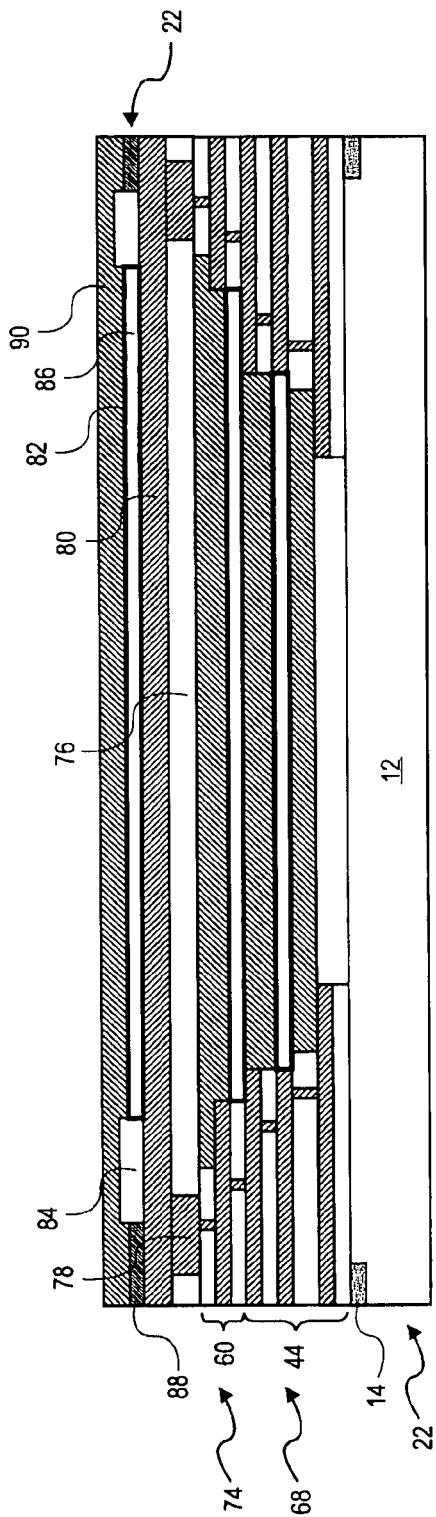
FIG. 17 is an elevational view of the memory device depicted in FIG. 16 after further processing.

In FIG. 17, further processing is carried out wherein third ferroelectric memory layer 86 is center masked and an eighth ILD (ILD8) layer 88 is formed to complement ILD7 layer 84 upon upper surface 82 of fourth electrode 80. The center mask is stripped and a fifth electrode 90 is patterned in a cross-point configuration to the patterning of fourth electrode 80. Similarly, the width of the patterned fifth electrode 90 may be selected to match line widths of fourth electrode 80. In one embodiment, line widths for fifth electrode 90 are in a range from about 0.13 microns to about 0.5 microns, and preferably from about 0.18 microns to about 0.25 microns.

Figure 18:
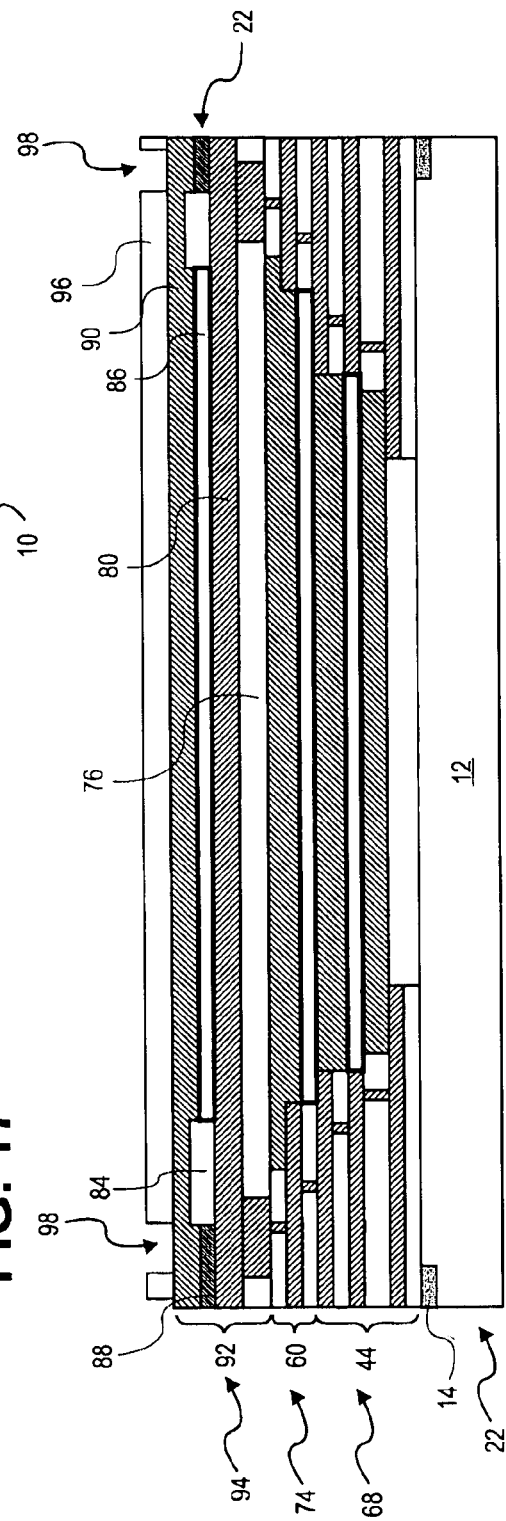
FIG. 18 is an elevational view of the memory device depicted in FIG. 17 after further processing.

As depicted in FIG. 18, a third topology 92 may include the vertical combination of ILD6 layer 76, fourth electrode 80, ILD7 layer 84, ILD8 layer 88, and fifth electrode 90. Similarly, a third ferroelectric memory structure 94 includes fourth electrode 80, third ferroelectric memory layer 86, fifth electrode 90, and the additional structures of third topology 92. Optionally, third ferroelectric memory structure 94 may include only fourth electrode 80, third ferroelectric memory layer 86, and fifth electrode 90. It is notable that the electrodes for first and second ferroelectric memory structures 68 and 74, respectively, are contained within cavities, but fourth and fifth electrodes 80 and 90, respectively, communicate to edge 22 of ferroelectric memory device 10.

A protective layer 96 is formed over fifth electrode 90. Protective layer 96 may be a passivation ILD material such as a polyimide material as is known in the art, or it may be an SiON film made by plasma-enhanced CVD (PECVD) at a low deposition temperature. Blanket formation of protective layer 96 may be done such as by spin-on processing of a polyimide material as is known in the art. In another embodiment, an inorganic material may be deposited, subject only to avoiding temperature elevation that will compromise the quality of the FEP layers if FEP layers are present. For example atomic layer CVD (ALCVD) may be carried out according to known technique to form protective layer 96. Protective layer 96 is patterned with a recess 98 to prepare for electrical connection.

Figure 19:
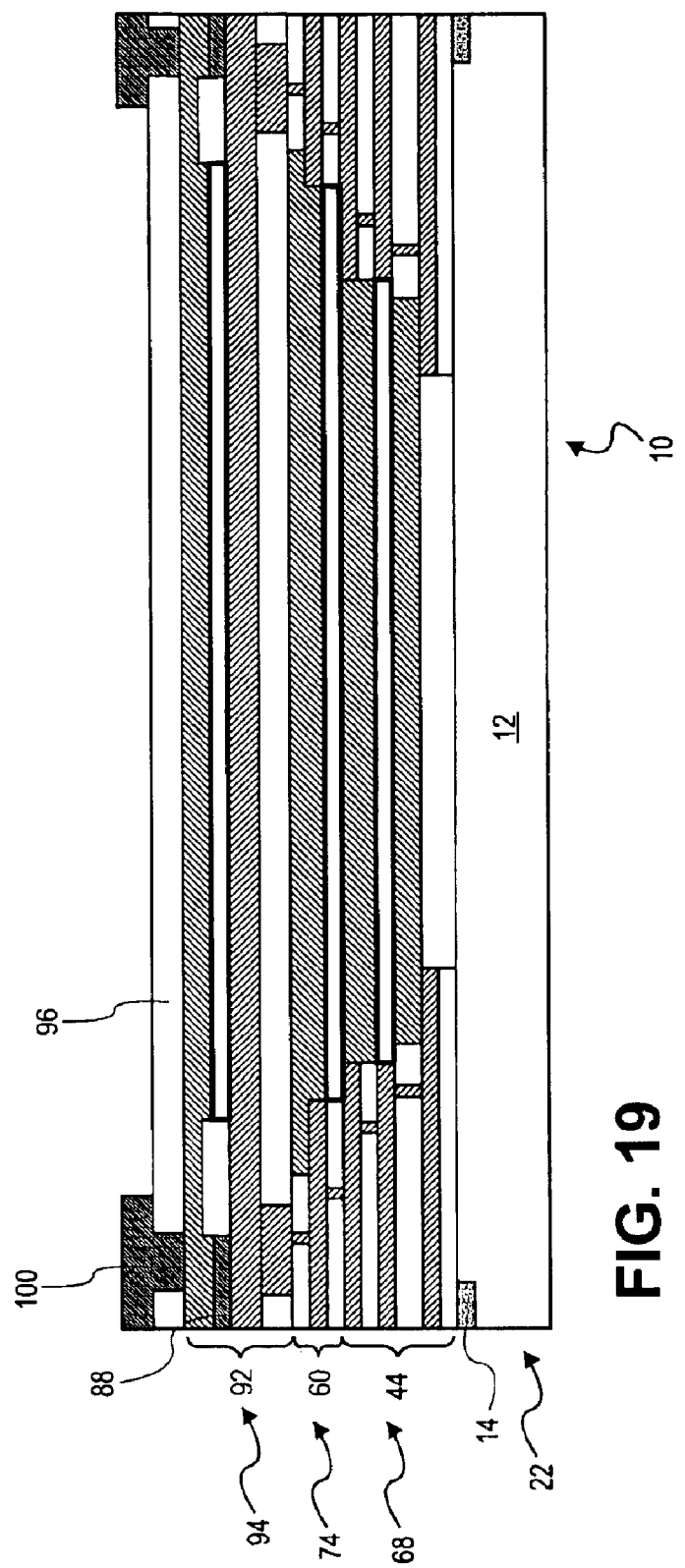
FIG. 19 is an elevational view of the memory device depicted in FIG. 18 after further processing.

Further processing is illustrated in FIG. 19. After the formation of recess 98, a bump pad layer 100 is deposited, filled into recess 98 and patterned. Bump pad layer 100 may be the terminal for ferroelectric memory device 10 for communication to supporting devices.

It may now be clear to one of ordinary skill in the art that a multi-rank FEP or FEP memory device may be formed according to embodiments depicted in this disclosure. In one embodiment, a three-rank ferroelectric memory device 10 is formed as is illustrated in FIG. 19. Following the selection of the preferred number of polymer memory ranks, electrical contact may be done by forming contacts in ferroelectric memory device 10 by various pin-out methods. FIG. 19 illustrates one electrical contact embodiment in which various pin-out precursors (such as M1 layer 20, M2 layer 34, M3 layer 40, M4 layer 50, and fourth and fifth electrodes 76, 90, depicted in previous figures) are pinned out through bump pad layer 100. Other pin-out methods may be selected according to a given application.

Figure 20:
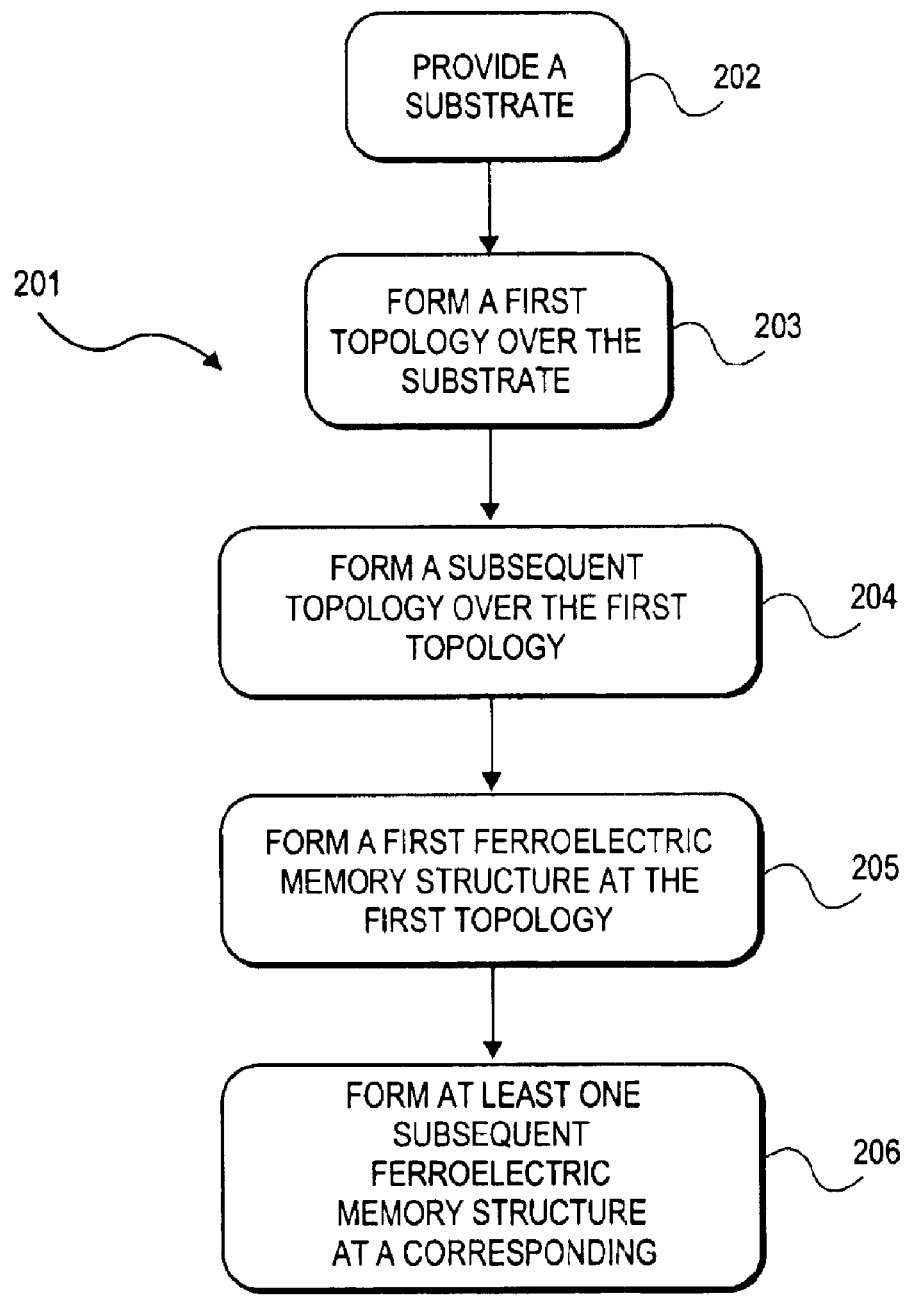
FIG. 20 is a process flow diagram of an embodiment.

FIG. 20 illustrates a process flow embodiment. The process 201 includes providing 202 a substrate and forming 203 a first topology over the substrate. The process 201 also includes forming 204 a subsequent topology over the first topology, followed by forming 205 a first ferroelectric memory structure at the first topology. After forming 205 the first ferroelectric memory structure at the first topology, the process includes forming 206 at least one subsequent ferroelectric memory structure at a corresponding subsequent topology as set forth herein.

Although FIGS. 1–19 illustrate a specific sequence, it may be understood that the ferroelectric memory device 10 may be built up to the top of second topology 60, which is to ILD5 layer 56, and a series of etching processes may be carried out to open cavity 62. By this process flow and before the formation of cavity 62, etching is carried out only for the several vias 30, 38, 48, and 58 that are within first and second topologies 44 and 60. Thereafter, etching in several processes may be carried out to form cavity 62. Thereby, similar processing tasks are grouped.

One embodiment of the present invention is a memory system. With reference to FIG. 21, a semiconductor die 210 may be produced from a silicon wafer 200 that may contain the CMOS logic region 14 or the like as set forth herein. Further, first, second, and third topologies 44, 60, and 92, with their appropriate metallization pin-out connections may be present on semiconductor die 210. A die 210 is an individual pattern, typically rectangular, on a substrate 12 that contains circuitry to perform a specific function. A semiconductor wafer 200 will typically contain a repeated pattern of such dies 210 containing the same functionality. Die 210 may further contain additional circuitry to extend to such complex devices as a monolithic processor with multiple functionality. Die 210 is typically packaged in a protective casing (not shown) with leads extending therefrom such as bump pad layers 100 depicted in FIG. 19 that provide access to the circuitry and memory structure(s) of the die 210 for unilateral or bilateral communication and control. In one embodiment, die 210 is encased in a chip package (not shown) such as a chip-scale package (CSP).

As shown in FIG. 22, two or more dies 210 one of which including at least one stacked ferroelectric memory device such as is depicted in 1–19 in accordance with the present invention may be combined, with or without protective casing, into a circuit module 220 or chipset to enhance or extend the functionality of an individual die 210. Circuit module 220 may be a combination of dies 210 representing a variety of functions, or a combination of dies 210 containing the same functionality. Some examples of a circuit module 220 include memory modules, device drivers, power modules, communication modems, processor modules and application-specific modules and may include multi-layer, multi-chip modules. Circuit module 220 may be a sub-component of a variety of electronic systems, such as a clock, a television, a cell phone, a personal computer, an automobile, an industrial control system, an aircraft and others. Circuit module 220 will have a variety of leads 222 extending therefrom providing unilateral or bilateral communication and control.

FIG. 23 shows one embodiment of a circuit module as a memory module 230 containing a structure for the inventive stacked ferroelectric memory device 10 such as that depicted in FIG. 19 or a subset thereof up to a given topology. Memory module 230 generally depicts a Single In-line Memory Module (SIMM) or Dual In-line Memory Module (DIMM). A SIMM or DIMM may generally be a printed circuit board (PCB) or other support containing a series of memory devices. While a SIMM will have a single in-line set of contacts or leads, a DIMM will have a set of leads on each side of the support with each set representing separate I/O signals. Memory module 230 contains multiple memory devices 232 contained on a support 235 such as a PCB, the number depending upon the desired bus width and the desire for parity. Memory module 230 may contain memory devices 232 on both sides of support 235. Memory module 230 accepts a command signal from an external controller (not shown) on a command link 234 and provides for data input and data output on data links 236. The command link 234 and data links 236 are connected to leads 238 extending from the support 235. Leads 238 are shown for conceptual purposes and are not limited to the positions shown in FIG. 23.

FIG. 24 shows an electronic system 240 containing one or more circuit modules 220 as described above containing at least one instance of the inventive stacked ferroelectric memory device 10 as described herein including subsets of the various topologies. Electronic system 240 generally contains a user interface 242. User interface 242 provides a user of the electronic system 240 with control or observation of the results of the electronic system 240. Some examples of user interface 242 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 242 may further describe access ports provided to electronic system 240. Access ports are used to connect an electronic system to the more tangible user interface components previously exemplified. One or more of the circuit modules 220 may be a processor providing some form of manipulation, control or direction of inputs from or outputs to user interface 242, or of other information either preprogrammed into, or otherwise provided to, electronic system 240. As will be apparent from the lists of examples previously given, electronic system 240 will often contain certain mechanical components (not shown) in addition to the circuit modules 220 and user interface 242. It will be appreciated that the one or more circuit modules 220 in electronic system 240 can be replaced by a single integrated circuit. Furthermore, electronic system 240 may be a subcomponent of a larger electronic system.

Figure 25:
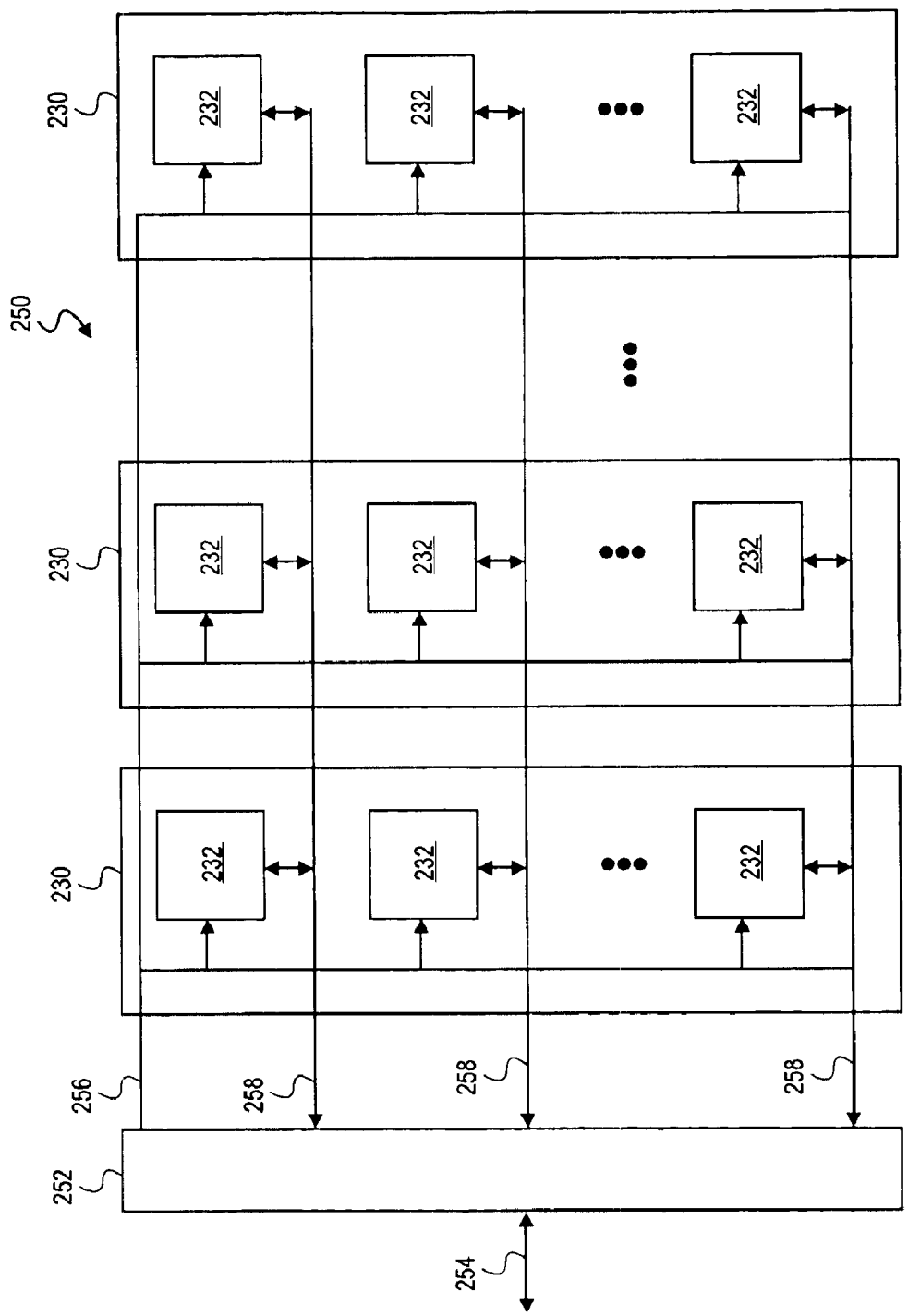
FIG. 25 shows one embodiment of an electronic system as memory system.

FIG. 25 shows one embodiment of an electronic system as memory system 250. Memory system 250 contains one or more memory modules 230 as described above including at least one instance of the inventive ferroelectric memory device 10 such as set forth herein in accordance with the present invention and a memory controller 252 that may include logic such as is contained in an embedded processor. Memory controller 252 provides and controls a bidirectional interface between memory system 250 and an external system bus 254. Memory system 250 accepts a command signal from the external bus 254 and relays it to the one or more memory modules 230 on a command link 256. Memory system 250 provides for data input and data output between the one or more memory modules 230 and external system bus 254 on data links 258.

Figure 26:
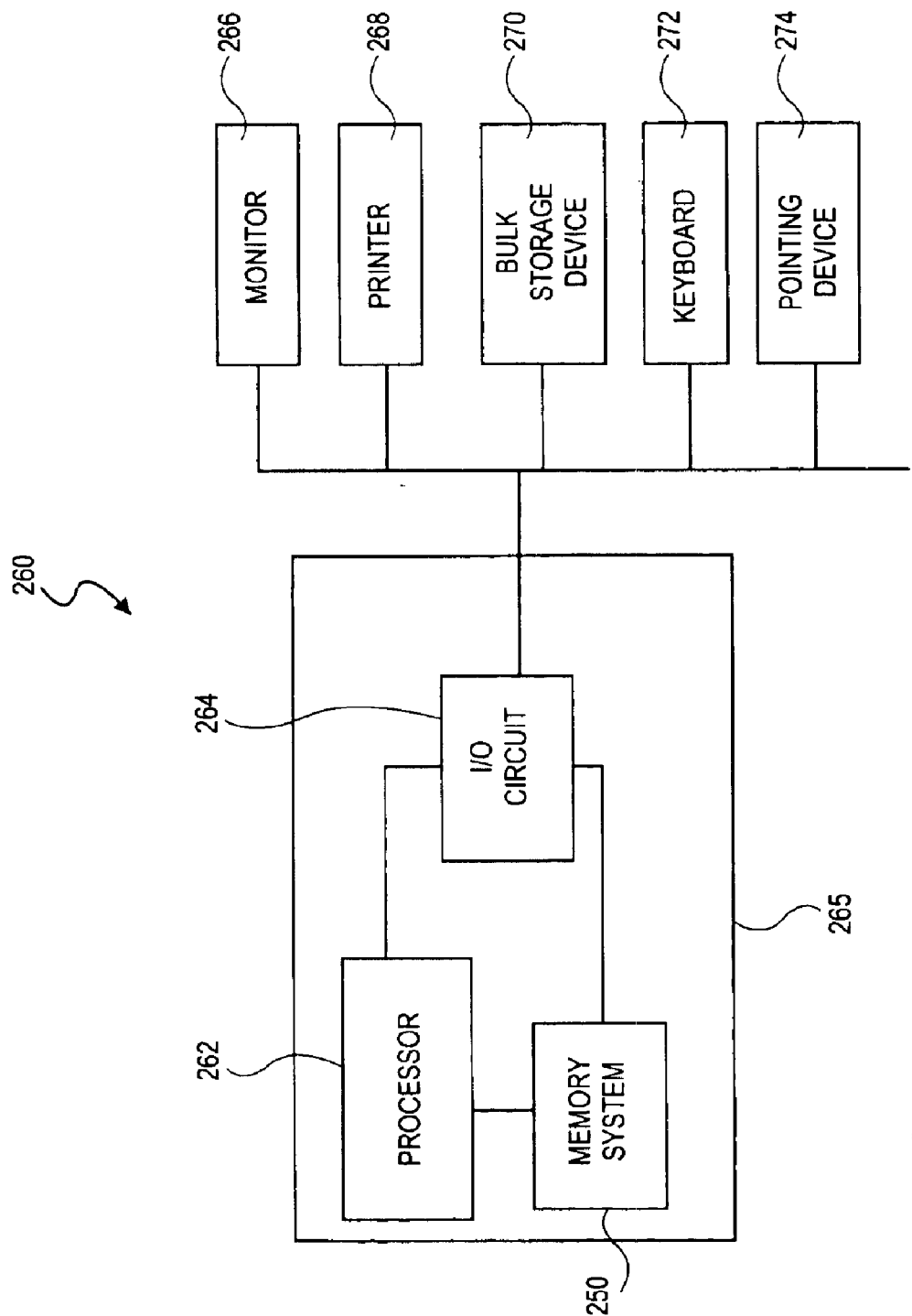
FIG. 26 shows a further embodiment of an electronic system as a computer system.

FIG. 26 shows a further embodiment of an electronic system as a computer system 260. Computer system 260 contains a processor 262 and a memory system 250 housed in a computer unit 265. Computer system 260 is but one example of an electronic system containing another electronic system, i.e. memory system 250, as a sub-component. The computer system 260 may contain an input/output (I/O) circuit 264 that is coupled to the processor 262 and the memory system 250. Computer system 260 optionally contains user interface components that are coupled to the I/O circuit 264. The I/O circuit 264 may be coupled a monitor 266, a printer 268, a bulk storage device 270, a keyboard 272 and a pointing device 274. It will be appreciated that other components are often associated with computer system 260 such as modems, device driver cards, additional storage devices, etc. It will further be appreciated that the processor 262 may include embedded stacked ferroelectric memory according to an embodiment. Further, memory system 250, I/O circuit 264 and stacked ferroelectric memory of computer system 260 can be incorporated on a single integrated circuit. Such single package processing units reduce the communication time between the processor 262 and the memory system 250.

According to an embodiment, the inventive system may comprise a support such as support 235 or support 265 that may contain a chip set thereon as depicted.

The data storage portion of the inventive memory system may include the FEP or FEO memory device that is disclosed herein, including the multi-rank, stacked FEP or FEO memory device as set forth herein. Other, more specific embodiments of the inventive memory system as set forth herein may be employed.

Low operating voltages are preferred and achieved by embodiments of the present invention. According to an embodiment, switching voltage may be in the range from about 0.5 V to less than about 9 V. Nonvolatile memory such as flash may require charge pump technology to achieve a sufficient voltage to write to the floating gate. The present invention presents a low-voltage technology for nonvolatile memory that may obviate the need for charge pump technology and other higher-voltage memory technologies.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process of forming a memory device, comprising:
    forming a first topology over a substrate;
    forming a first ferroelectric memory structure at the first topology and after forming the first topology; and
    forming at least one subsequent ferroelectric memory structure over the first ferroelectric memory structure, wherein forming a first topology includes:
    forming a first dielectric layer over the substrate;
    forming a first metal layer over the first dielectric layer, wherein first metal layer has thickness ranging from about 0.1 micron to about 1 micron;
    forming a second dielectric layer over the first metal layer;
    forming a first electrode adjacent to the second dielectric layer;
    forming a second metal layer over the second dielectric layer;
    forming a third dielectric layer over the second metal layer;
    forming a third metal layer over the third dielectric layer; and
    forming a first-filed via between the first metal layer and the second metal layer.

2. The process according to claim 1, wherein forming a first ferroelectric memory structure further includes:
    forming a first ferroelectric polymer memory layer over the first electrode; and
    forming a second electrode over the first ferroelectric polymer memory layer.

3. The process according to claim 1, wherein forming a first ferroelectric memory structure and forming a subsequent ferroelectric memory structure further includes:
    forming a first ferroelectric polymer memory layer over the first electrode;
    forming a second electrode over the first ferroelectric polymer memory layer;

forming a second ferroelectric polymer memory layer over the second electrode; and forming a third electrode over the second ferroelectric polymer memory layer.

4. A method, comprising:

forming a first electrode over a substrate;

forming a first ferroelectric oxide memory layer has a thickness ranging from about 500 Å to about 2,500 Å;

forming a second electrode over the first ferroelectric oxide memory layer; and forming a second ferroelectric oxide memory layer over the first ferroelectric oxide memory layer, whererin the second ferroelectric oxide memory layer is larger than the first ferroelectric oxide memory layer.

5. The method of claim 4, wherein the second ferroelectric oxide memory layer is formed so that a thickness of the first ferroelectric oxide memory layer is substantially equal to a thickness of the second ferroelectric oxide memory layer and so that a width of the second ferroelectric oxide memory layer is greater than a width of the first ferroelectric oxide memory layer.

6. The method of claim 4, wherein forming the first ferroelectric oxide memory layer includes forming a ferroelectric oxide memory layer by chemical vapor deposition, spin-on deposition, or physical vapor deposition.

7. The method of claim 4, the first electrode has a with that is a minimum feature of a photolithography technology, selected from 0.25 micron, 0.16 micron, 0.13 micron, and 0.11 micron.

8. The method of claim 4, further comprising:

forming a via coupled to the first electrode prior to forming the first ferroelectric oxide memory layer.

9. A method, comprising:

forming a structure having a cavity, wherein the structure is formed by:
 forming a first electrode material over a substrate;
 forming a first dielectric layer over the substrate and adjacent the first electrode material, wherein portions of the first electrode material and the first dielectric material define the cavity;

forming a via coupled to the first electrode; and forming a first ferroelectric memory layer in the cavity over the first electrode material, wherein the first ferroelectric memory layer has a thickness ranging from about 500 Å to about 2,000 Å.

10. The method of claim 9, wherein forming a first ferroelectric memory layer includes forming a first ferroelectric oxide memory layer in the cavity.

11. The method of claim 9, wherein forming a first ferroelectric memory layer includes forming a first ferroelectric polymer memory layer in the cavity.

12. The method of claim 9, wherein forming a first ferroelectric memory layer includes forming a first ferroelectric memory layer in the cavity after forming the via.

13. The method of claim 9, wherein forming a via includes forming a via filled with fungsten coupled to the first electrode.

14. The method of claim 9, further comprising:

forming a second electrode material over the first ferroelectric memory layer; and forming a second ferroelectric memory layer in the cavity and over the first ferroelectric memory layer, whererin a volume of the second ferroelectric memory layer is greater than a volume of the first ferroelectric memory material.

15. The method of claim 14, further comprising:

forming a conductive layer over the second ferroelectric memory layer;

planarizing the conductive layer; and patterning the conductive layer to form a third electrode; and forming an interlayer dielectric (ILD) layer over the third electrod; and forming a third ferroelectric memory layer over the interlayer dielectric layer.

* * * * *

UNITED STATES PATENT AND TRADEMARK OFFICE
CERTIFICATE OF CORRECTION

PATENT NO. : 6,960,479 B2
DATED : November 1, 2005
INVENTOR(S) : Li et al.

It is certified that error appears in the above-identified patent and that said Letters Patent is hereby corrected as shown below:

Column 12,
Line 40, after "has" insert -- a --.

Column 13,
Line 7, delete "forming a" and insert -- wherein the --.
Line 27, delete "with" and insert -- width --.
Line 29, delete "0.16," and insert -- 0.18, --.

Column 14,
Line 18, delete "fungsten" and insert -- tungsten --.
Line 35, delete "electrod;" and insert -- electrode; --.

Signed and Sealed this

Fourteenth Day of February, 2006

JON W. DUDAS
*Director of the United States Patent and Trademark Office*